United States Patent [19]
Woo et al.

[11] Patent Number: 6,103,085
[45] Date of Patent: Aug. 15, 2000

[54] ELECTROPLATING UNIFORMITY BY DIFFUSER DESIGN

[75] Inventors: Christy Mei-Chu Woo, Cupertino; John A. Iacoponi, San Jose; Kai Yang, Fremont, all of Calif.

[73] Assignee: Advanced Micro Devices, Inc., Sunnyvale, Calif.

[21] Appl. No.: 09/205,584

[22] Filed: Dec. 4, 1998

[51] Int. Cl.⁷ .................................................. C25D 5/04
[52] U.S. Cl. ...................... 205/143; 205/122; 205/123; 205/133
[58] Field of Search .................... 205/122, 123, 205/133, 98, 237, 275, 238, 148, 143; 204/DIG. 7, 276, 234

[56] References Cited

U.S. PATENT DOCUMENTS

| | | |
|---|---|---|
| 4,304,641 | 12/1981 | Grandia et al. ........................ 204/23 |
| 5,731,678 | 3/1998 | Zila et al. . |
| 6,001,235 | 12/1999 | Arken et al. ............................ 205/137 |

*Primary Examiner*—Kathryn Gorgos
*Assistant Examiner*—Christopher Keehan

[57] ABSTRACT

Workpieces, such as semiconductor wafers, are electroplated with improved thickness uniformity by providing a diffuser member intermediate the cathode and anode of a fountain-type electroplating apparatus. The diffuser or member has a pattern of openings specifically designed to prevent channeling and/or selective directing of electrolyte towards the workpiece. In one embodiment, the diffuser member comprises a spiral-shaped pattern of openings originating at the center of the diffuser member and extending to the periphery thereof.

18 Claims, 2 Drawing Sheets

ELECTROPLATING UNIFORMITY BY DIFFUSER DESIGN

FIELD OF THE INVENTION

The present invention relates to a method and system for electroplating workpieces employing a "fountain" type electroplating system. More particularly, the invention relates to a method and system for obtaining improved uniformity of plating thickness across the maximum lateral dimension of a workpiece. Even more particularly, the invention relates to a method and system for "back-end" metallization of integrated circuit semiconductor devices formed in or on a semiconductor wafer.

BACKGROUND OF THE INVENTION

Metal films are conventionally utilized in semiconductor manufacturing technology to form electrically conductive contacts to active as well as passive device regions or components formed in or on a semiconductor wafer substrate, as well as for filling via holes, interlevel metallization, and interconnection routing patterns for wiring together the components and/or regions. Because many large scale integration (LSI), very large scale integration (VLSI), and ultra large scale integration (ULSI) devices presently manufactured are very complex and require multiple levels of metallization for interconnections, etc., as described above, it has been common to repeat metallization processing multiple times, e.g., to form five or more levels of metallization interconnected by conductive vias. Thus, in the course of manufacturing such devices, each wafer requires passage through one or more metallization systems arranged along a device production path.

Metals commonly employed for "back-end" metallization purposes include nickel, titanium, tantalum, aluminum, chromium, gold, silver, copper, and alloys thereof, which metals may be applied to the semiconductor wafers by a variety of techniques, including electroplating, electroless plating, dipping, pasting, spraying, physical vapor deposition (e.g., evaporation, sputtering, ion plating, etc.), and chemical vapor deposition (including plasma enhanced chemical vapor deposition). Of the enumerated metals and deposition techniques, metallization by electroplated copper or copper-based alloys is particularly attractive for use in LSI, VLSI, and ULSI multilevel metallization systems used in "back-end" processing of semiconductor wafers. Copper and copper-based alloy metallization systems have very low resistivities, i.e., even lower than that of previously preferred systems utilizing aluminum and aluminum alloys, as well as significantly higher resistance to electromigration. Moreover, copper and its alloys enjoy a considerable cost advantage over a number of the above-enumerated metals, notably silver and gold, and in contrast to aluminum and refractory-type metals, can be readily deposited in good quality, bright layer form by well-known electroplating techniques, at deposition rates compatible with the requirements of device manufacturing throughput.

However, a significant drawback associated with electroplated metallization which has resulted from the recent trend toward use of very large diameter semiconductor wafers, e.g., eight (8) inch wafers, is the difficulty in obtaining uniform electrodeposited layer thicknesses across the maximum lateral dimension or extent of the wafer, e.g., across the 8 inch diameter. A conventional arrangement for alleviating this drawback is schematically illustrated with reference to FIGS. 1–3.

Referring to FIG. 1, very schematically shown therein is a "fountain" type electroplating system 1 for metallizing planar-surfaced workpieces such as semiconductor wafer substrates, and is conceptually similar to commercially available systems, e.g., from Semitool, Inc., Kalistell, Mont. As illustrated, system 1 comprises an electroplating vessel or chamber 2 enclosing therein a cathode electrode 3, typically circularly shaped and affixed to rotatable shaft 4, and an anode electrode 5, also typically circularly shaped and in parallel spaced opposition thereto. Anode 5 is affixed to a hollow, optionally rotatable shaft 6 forming part of an electrolyte recirculation circuit 7, one end of which terminates at centrally positioned opening 8 formed in the anode and acts as an orifice 9 for circulating liquid electrolyte 10 therethrough. Inlet 11 of the electrolyte recirculation circuit 7 is positioned at an upper portion of electroplating chamber 2, preferably at a location above the cathode electrode 3. Recirculation circuit 7 further includes conduit 12 connected to inlet 11, an electrolyte pump or equivalent recirculation device 13, and conduit 14 connected to hollow, rotatable anode shaft 8. Electroplating power supply 15 is electrically connected, in conventional manner, to the cathode and anode electrodes, via respective leads 16, 17.

Cathode 3 includes means, not shown for illustrative simplicity, for mounting a workpiece 18, typically a semiconductor wafer, on and in electrical contact with the lower surface thereof. As illustrated, the maximum lateral dimension of the wafer corresponds to its diameter, shown in the figure by reference to opposing radii +r and −r. Positioned within the space between the cathode and anode electrodes and parallel thereto, is a diffuser member 19 (shown in top plan view in FIG. 2). Diffuser member 19, typically disk-shaped and optionally rotatable around its central axis, is made of a non-conductive material (e.g., a rigid polymeric material) or a conductive material (e.g., a metal) coated with a non-conductive material, and comprises a plurality of circularly-shaped openings 20 formed therethrough. In the illustrated conventional diffuser member 19, openings 20 are distributed in a pattern of concentric circles with generally similar spacings 21 between adjacent circles. The diameter of the diffuser member 19 is generally selected to correspond with that of the workpiece 18. For example, the diameter of the diffuser member is about 8 inches when employing standard 8 inch semiconductor wafer substrates. The diameter, number of concentric circles, inter-circle spacing, and inter-hole spacing of the openings 20 are determined based upon the diffuser member diameter and workpiece requirements, and typically are about 2–6 mm, 4–10, 5–10 mm, and 5–11 mm, respectively, for an 8 inch diameter diffuser member.

In a typical plating operation, e.g., electroplating copper onto a semiconductor wafer workpiece 18, cathode 3, anode 5, and diffuser member 19 are coaxially aligned in the electroplating chamber 2 along a common central axis c-c', with cathode-diffuser member spacing 22 and anode-diffuser member spacing 23 each in the range from about 10 to about 15 mm. At least one of the anode, cathode, and diffuser member is rotated about central axis c-c', typically at from about 5 to about 50 rpm. Since conventional copper electroplating baths and conditions such as voltages, current densities, and electrolyte temperatures are employed, the details of such will not be described. Rates of electrolyte 10 recirculation through recirculation circuit 7 are typically from about 1 to about 6 gpm (gal./min.). As indicated by the arrows in the drawing, electrolyte 10, under the influence of the electric field applied between the cathode 3 and anode 5 (and for kinetic and diffusion reasons), flows from the orifice 9 in anode 5 along paths 24, is channeled through openings 20 in diffuser member 19 along paths 25, from the diffusion member to the workpiece 18 via paths 26, and thence to outlet 11 for recirculation.

While the above-described fountain-type electroplating system 1, when provided with a conventionally configured diffuser member 19, as illustrated, provides an improvement in plating uniformity over the lateral extent of relatively small-dimensioned workpieces, such as 3–4 inch diameter semiconductor wafers, unsatisfactory plating uniformity is frequently encountered when metallizing the very large diameter (i.e., 8 inches) semiconductor wafers in common use at present. In addition, the problem of poor plating uniformity is exacerbated when, as is common practice in the art, multiple levels of metallization are formed, due to additive effects arising from unevenness of successive, overlying plated layers.

Referring now to FIG. 3, shown therein is a graph indicating plating thickness variation (in arbitrary units) as a function of position along the lateral (i.e., radial) dimension of a plated workpiece (e.g., an 8 inch diameter semiconductor wafer) obtained with the use of such conventional fountain-type electroplating apparatus as is illustrated in FIG. 1. As is evident from a comparison of the graph of FIG. 3 with the pattern of openings of the diffuser member of FIG. 2, the pattern of thickness variation is substantially correlated to the pattern of concentric, radially spaced apart circles formed by the openings 20 in the diffuser member 19. Such result suggests that the diffuser member 19 channels the electrolyte into a pattern of streams having a higher concentration of platable species than the bulk electrolyte, and/or selectively directs a greater amount of electrolyte, and thus a greater amount of platable species, to specific areas of the workpiece surface, as determined by the concentric pattern of openings formed in the diffuser member. The result is an undesirably enhanced rate of electroplating at corresponding locations along the workpiece surface, with consequent plating thickness variation.

Thus there exists a need for an improved system and method for electroplating workpieces which substantially reduces or eliminates the above-described drawback of poor plating thickness uniformity associated with use of conventional diffuser members in fountain-type electroplating systems. Further, there exists a need for an improved system and method for electroplating metallization processing of large diameter semiconductor wafer workpieces employed in the manufacture of LSI, VLSI, and ULSI semiconductor devices.

DISCLOSURE OF THE INVENTION

An advantage of the present invention is an improved method for electroplating workpieces in a fountain-type plating system comprising a diffuser member.

A further advantage of the present invention is an improved method for metallizing semiconductor wafer workpieces with increased plating thickness uniformity.

A still further advantage of the present invention is an improved fountain type electroplating system comprising a diffuser member designed for providing greater plating thickness uniformity over the entire lateral dimension of a workpiece.

Additional advantages, and other features of the present invention will be set forth in the description which follows and in part will become apparent to those having ordinary skill in the art upon examination of the following or may be learned from the practice of the present invention. The advantages may be realized and obtained as particularly pointed out in the appended claims.

According to the present invention, the foregoing and other advantages are achieved in part by a method for electroplating a workpiece surface, which method provides improved plating thickness uniformity, comprising:

providing a workpiece including a surface having a maximum lateral dimension;

mounting the workpiece on a cathode of an electroplating apparatus, the electroplating apparatus including an anode in parallel spaced opposition thereto, the anode including an opening in a central portion thereof for flowing a liquid electrolyte therethrough and into the space between the cathode and anode;

providing an electrolyte diffuser member in the space between the cathode and the anode and in parallel spaced opposition thereto, the diffuser member including a predetermined pattern of openings formed therein for passage of the electrolyte therethrough, said pattern configured for prevention of channeling and/or selective directing of electrolyte towards the cathode, thereby providing uniform electroplating thickness over the maximum lateral dimension of the workpiece surface; and electroplating the workpiece surface to form a uniform thickness plating layer thereon.

In embodiments according to the present invention, at least one of the cathode, anode, and diffuser member is rotated about a central axis, the diffuser member is made of a non-conductive material or a conductive material coated with a non-conductive material and comprises a disk having a spiral-shaped pattern of openings formed therein for uniform passage of electrolyte therethrough, the spiral-shaped pattern originating near the central axis of the disk and terminating near the periphery of the disk.

In embodiments according to the present invention, the method comprises copper or copper-based metallization plating of a semiconductor wafer of 8 inch maximum lateral dimension and having at least one active device region formed therein or thereon; the diffuser member comprises a disk having a diameter suitable for use with the 8 inch diameter wafer, and includes a spiral-shaped pattern of circularly-shaped openings formed therein, the diameter of each of the openings being in the range of from about 2 to about 6 mm, adjacent openings along a line of the pattern being spaced apart by about 5 to about 10 mm, adjacent lines of the pattern being spaced apart by from about 5 to about 11 mm; the cathode, anode, or diffuser member, preferably the cathode, is rotated at from about 5 to about 50 rpm; and electrolyte flows through the opening in the anode at a flow rate of from about 1 to about 6 gpm.

According to another aspect of the present invention, a system for electroplating a workpiece surface with improved plating thickness uniformity comprises an electroplating chamber including:

a cathode, the cathode adapted for mounting thereon a workpiece having a maximum lateral dimension;

an anode in parallel-spaced opposition to the cathode, the anode including an opening in a central portion thereof for flowing liquid electrolyte therethrough into the space between the cathode and anode;

an electrolyte diffuser member in the space between the cathode and anode and in parallel spaced opposition thereto, the diffuser member including a predetermined pattern of openings formed therein for passage of the electrolyte therethrough and configured for prevention of channeling and/or selective directing of electrolyte towards the cathode, thereby providing uniform electroplating thickness over the maximum lateral dimension of a workpiece mounted on the cathode; and an electrolyte recirculation circuit for supplying electrolyte from the electroplating chamber to the anode opening.

In embodiments according to the present invention, at least one of the cathode, anode, and diffuser member is rotatable about a central axis, the diffuser member comprises a disk of diameter comparable to that of a wafer-shaped workpiece, is made of a non-conductive material or a conductive material coated with a non-conductive material, and includes a spiral-shaped pattern of circular or polygonal openings formed therein for uniform passage of electrolyte therethrough, the spiral-shaped pattern originating near the center of the disk and terminating near the periphery thereof.

Additional advantages of the present invention will become readily apparent to those skilled in the art from the following detailed description, wherein only the preferred embodiments of the present invention are shown and described, simply by way of illustration but not limitation. As will be realized, the invention is capable of other and different embodiments, and its several details are capable of modification in various obvious respects, all without departing from the spirit of the present invention. Accordingly, the drawings and description are to be regarded as illustrative in nature and not as restrictive.

BRIEF DESCRIPTION OF THE DRAWINGS

The following detailed description of the embodiments of the present invention can best be understood when read in conjunction with the following drawings, wherein.

DESCRIPTION OF THE INVENTION

Figure 1:
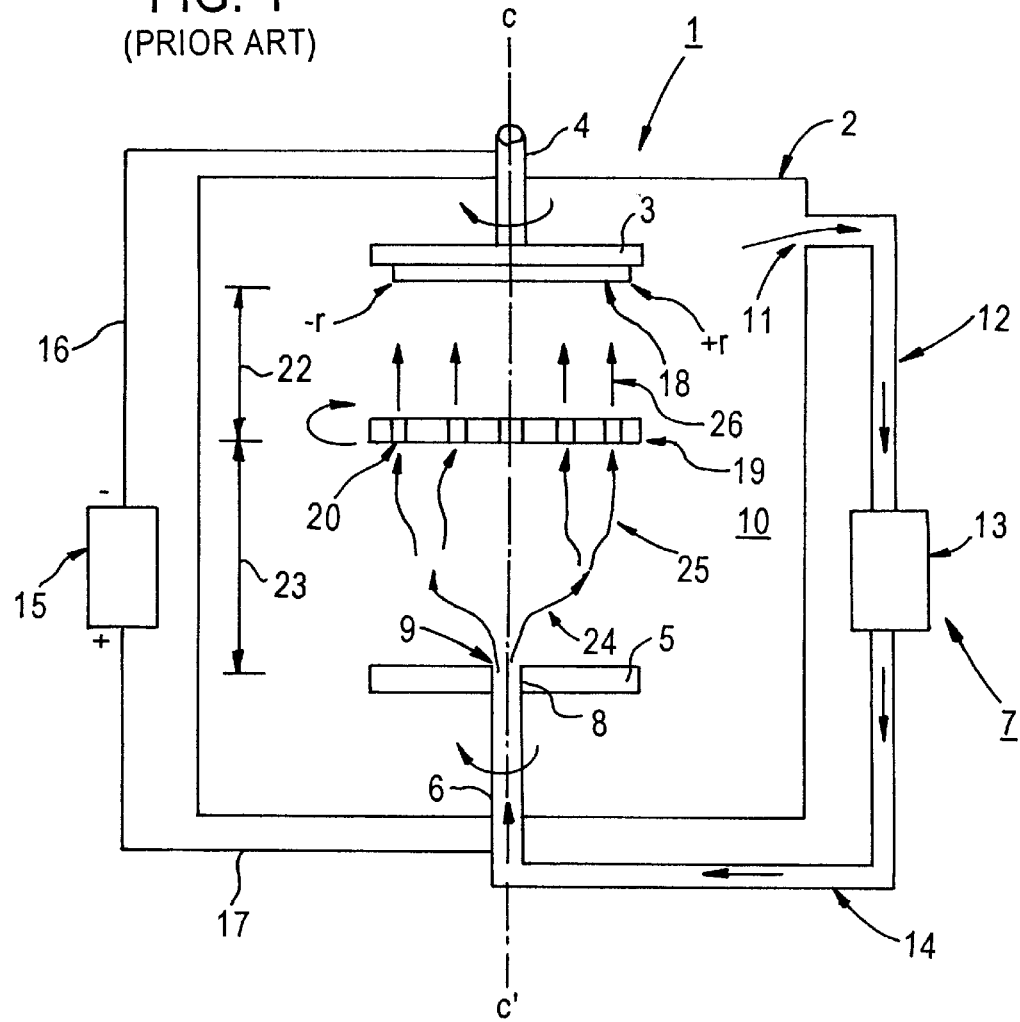
FIG. 1 is a simplified, schematic cross-sectional view illustrating a conventional fountain-type electroplating system incorporating a diffuser member according to the conventional art.
Figure 4:
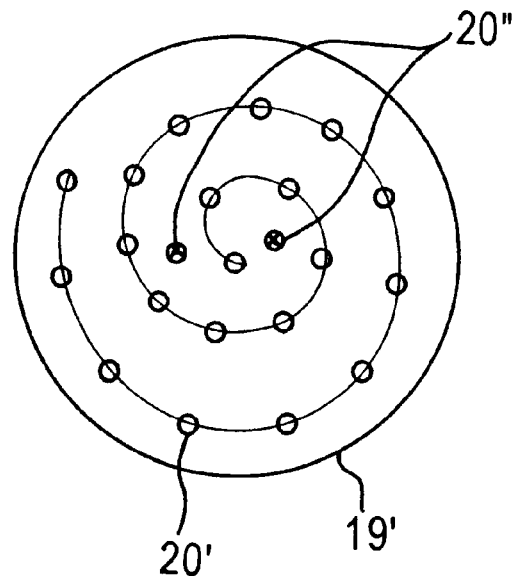
FIG. 4 is a simplified, schematic plan view of a diffuser member designed according to the principle of the present invention.

Referring now to FIG. 4, shown therein in simplified, schematic plan view, is an embodiment of an improved diffuser member 19' according to the present invention and adapted for use in a conventional fountain-type electroplating system such as illustrated in FIG. 1. As illustrated, diffuser member 19' is similar in all respects to conventional diffuser member 19 but for the pattern of openings 20 formed therein. That is, diffuser member 19' is disk-shaped and comprises a non-conductive material such as a rigid polymeric material of suitable thickness, or a conductive material coated with a non-conductive material, in order to avoid creation of a bi-polar electrode due to placement of the diffuser member between the anode and cathode. In addition, the diameter of the disk-shaped diffuser member 19' is selected to correspond with the maximum lateral dimension of the workpiece 18, typically a semiconductor wafer workpiece of diameter up to about 8 inches.

Figure 2:
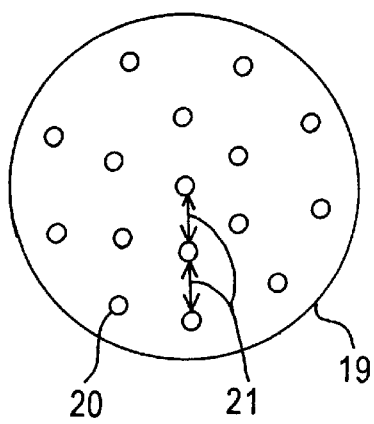
FIG. 2 is a simplified, schematic plan view of the conventional diffuser member of the electroplating system of FIG. 1.
Figure 3:
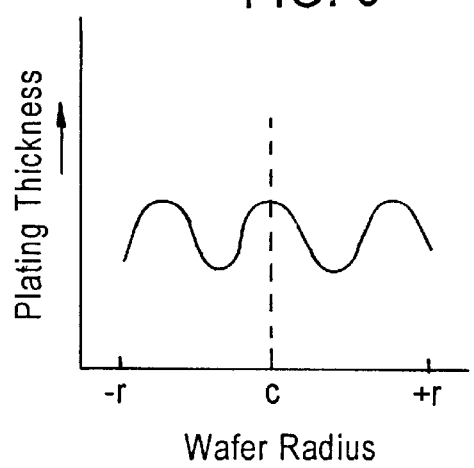
FIG. 3 is a graph illustrating the variation of plating thickness along the diameter of a wafer-type workpiece obtained by means of the conventional system of FIG. 1.
Figure 5:
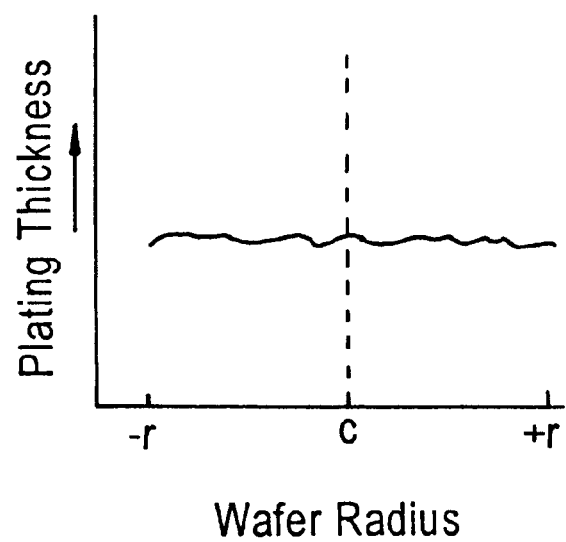
FIG. 5 is a graph illustrating the variation of plating thickness along the diameter of a wafer-type workpiece obtained by means of a fountain-type electroplating system including the inventive diffuser member of FIG. 4.

As should be readily apparent from a comparison of FIGS. 2 and 4, in a departure from the conventional pattern of openings 20, the diffuser member 19' according to the invention comprises a spiral-shaped pattern of openings 20', the spiral originating near the center of the diffuser member and extending near to the periphery thereof. Since at least one of the cathode, anode, and diffuser member rotates about central axis c-c' during operation of the electroplating system, the effect of the essentially continuously expanding spiral-shaped pattern of openings 20' in the diffuser member 19' is to substantially reduce or eliminate the undesirable channeling or selective directing of the electrolyte 10 as occurs with the conventional diffuser member 19, leading to plating thickness variation, as described above. FIG. 5 is analogous to the graph of FIG. 3 and shows the plating thickness variation across a wafer of same diameter, obtained with the electroplating system of FIG. 1 operated under identical conditions as before but modified to employ the inventive diffuser member 19'. As is clearly evident from a comparison of FIGS. 3 and 5, provision of the inventive diffuser member substantially reduces the plating thickness variation across the diameter of the wafer.

As illustrated in FIG. 4, several additional openings 20" may be placed at the central portion of the diffuser member 19' in order to provide an adequate amount of electrolyte flow at the origin of the spiral. Also, while in he illustrated embodiment, openings 20' and 20" are shown as circular, other, variously shaped polygonal openings of comparable areal size may also be employed with equal effect. Moreover, the openings need not extend perpendicularly through the thickness of the diffuser member, e.g., V-shaped and inverted V-shaped openings are equally efficacious in achieving the objective of uniform plating thickness. Also, while in the illustrated embodiment, a spiral-shaped pattern of openings is employed to eliminate electrolyte channeling and/or selective directing, other patterns and/or arrangements of openings may be devised within the scope of ordinary skill for achieving the same or equivalent result, without departing from the spirit of the present disclosure.

By way of example but not limitation, for a disk-shaped diffuser member 19' of 8 inch diameter used with 8 inch diameter semiconductor wafer workpieces 18, a spiral-shaped pattern of openings 20' may comprise circularly-shaped openings with a diameter from about 2 to about 7 mm, with adjacent openings in a line of the pattern spaced apart by about 5 to about 10 mm, and with adjacent lines of the pattern spaced apart about 5 to about 11 mm.

Alternatively, the openings may comprise polygonally-shaped openings of areal size substantially equal to the circularly-shaped openings, i.e., from about 3 to about 40 $mm^2$, with adjacent openings along a line of the pattern spaced apart about 5 to about 10 mm, and with adjacent lines of the pattern spaced apart about 5 to about 11 mm.

The present invention enjoys utility in the fabrication of various types of devices in addition to the specifically disclosed multi-metal level semiconductor devices, including, but not limited to, circuit boards, decorative products, etc.

In the previous descriptions, numerous specific details are set forth, such as specific materials, structures, processes, etc., in order to provide a thorough understanding of the present invention. However, as one of ordinary skill in the art would recognize, the present invention can be practiced without resorting to the details specifically set forth. In other instances, well-known processing details and techniques have not been described in detail in order not to unnecessarily obscure the present invention.

Only the preferred embodiments of the invention are shown and described herein. It is to be understood that the invention is capable of changes or modifications within the scope of the invention.

What is claimed is:

1. A method of electroplating a workpiece surface, with improved plating thickness uniformity, the method comprising:

providing a workpiece including a surface having a maximum lateral dimension;

mounting said workpiece on a surface of a cathode of an electroplating apparatus, said electroplating apparatus including an anode in parallel spaced opposition thereto, said anode including an opening in a central surface portion thereof, said anode surface opening forming an orifice for flowing a liquid electrolyte therethrough and into the space between the cathode and anode;

providing an electrolyte diffuser member in the space between the cathode and anode and in parallel spaced opposition thereto, the diffuser member including a pattern of openings formed therein for reception and passage of the electrolyte therethrough, said pattern configured for prevention of channeling and/or selective directing of electrolyte flowing towards the cathode from said anode surface orifice, thereby providing substantial uniformity of electroplating thickness over said maximum lateral dimension of said workpiece surface, said diffuser member comprising a disk having a spiral-shaped pattern of substantially equally sized openings formed therein for uniform passage of electrolyte therethrough, said spiral-shaped pattern originating proximate the center of the disk and terminating proximate the periphery thereof; and electroplating said workpiece surface to form a substantially uniform thickness plating layer thereon.

2. The method as in claim 1, comprising providing a diffuser member made of a non-conductive material or a conductive material coated with a non-conductive material.

3. The method as in claim 1, comprising providing a diffuser disk of a diameter suitable for use with an 8 inch diameter wafer workpiece and having a spiral-shaped pattern of circularly-shaped openings formed therein, the diameter of each of said openings being in the range of from about 2 to about 7 mm, adjacent openings along a line of said pattern being spaced apart from about 5 to about 10 mm, and adjacent lines of said pattern being spaced apart from about 5 to about 11 mm.

4. The method as in claim 1, comprising rotating at least one of the cathode, anode, and diffuser member about a central axis.

5. The method as in claim 4, comprising rotating the cathode at about 5 to about 50 rpm and flowing electrolyte through the opening in the anode at a flow rate of from about 1 to about 6 gpm.

6. The method as in claim 1, comprising providing a semiconductor wafer workpiece including at least one active semiconductor device region formed therein or thereon and the maximum lateral dimension of the workpiece surface corresponds to the wafer diameter.

7. The method as in claim 6, comprising electroplating a metal on said wafer surface for metallizing the at least one active device region.

8. The method as in claim 7, comprising electroplating copper or a copper-based alloy on said wafer surface.

9. A system for electroplating a workpiece surface with improved plating thickness uniformity, the system comprising an electroplating chamber including:

a cathode, said cathode adapted for mounting on a surface thereof a workpiece having a maximum lateral dimension;

an anode in parallel spaced opposition to said cathode, said anode including an opening in a central surface portion thereof, said anode surface opening forming an orifice for flowing liquid electrolyte therethrough and into the space between said cathode and anode;

an electrolyte diffuser member in the space between said cathode and anode and in parallel spaced opposition thereto, said diffuser member including a pattern of openings formed therein for reception and passage of the electrolyte therethrough and configured for prevention of channeling and/or selective directing of electrolyte flowing towards the cathode from said anode surface orifice, thereby providing maximum uniformity of electroplating thickness over the maximum lateral dimension of a workpiece mounted on said cathode, said diffuser member comprising a disk having a spiral-shaped pattern of substantially equally sized openings formed therein for uniform passage of electrolyte therethrough, said spiral-shaped pattern originating proximate the center of the disk and terminating proximate the periphery thereof; and an electrolyte recirculation circuit for supplying liquid electrolyte from said electroplating chamber to the anode surface opening forming said orifice.

10. The system as in claim 9, wherein said diffuser member comprises a non-conductive material or a conductive material covered by a layer of non-conductive material.

11. The system as in claim 9, wherein said pattern of openings comprises circularly-shaped openings.

12. The system as in claim 11, wherein the diameter of each of said circularly-shaped openings is from about 2 to about 7 mm.

13. The system as in claim 12, wherein adjacent openings along a line of said pattern are spaced apart about 5 to about 10 mm and adjacent lines of said pattern are spaced apart about 5 to about 11 mm.

14. The system as in claim 9, wherein said pattern of openings comprises polygonally-shaped openings.

15. The system as in claim 14, wherein the polygonally-shaped openings are dimensioned such that the area of each opening is from about 3 to about 40 $mm^2$.

16. The system apparatus as in claim 15, wherein adjacent openings along a line of said pattern are spaced apart about 5 to about 10 mm and adjacent lines of said pattern are spaced apart about 5 to about 11 mm.

17. The system as in claim 9, wherein at least one of said cathode, anode, and diffuser member is rotatable about a central axis.

18. The system as in claim 9, wherein said cathode is adapted to mount a semiconductor wafer workpiece thereon and a diameter of the diffusion member corresponds to the diameter of the wafer.

* * * * *